United States Patent
Son et al.

(10) Patent No.: US 10,451,756 B2
(45) Date of Patent: Oct. 22, 2019

(54) APPARATUS AND METHOD FOR CALCULATING EFFICIENT 3D TRAVELTIME BY USING COARSE-GRID MESH FOR SHALLOW DEPTH SOURCE

(71) Applicant: Korea Institute Of Geoscience And Mineral Resources, Daejeon (KR)

(72) Inventors: Woohyun Son, Sejong-si (KR); Sukjoon Pyun, Incheon (KR); Ho-Young Lee, Daejeon (KR); Nam-Hyung Koo, Daejeon (KR); Changsoo Shin, Seoul (KR)

(73) Assignee: Korea Institute of Geoscience and Mineral Resources, Daejeon (KR)

( * ) Notice: Subject to any disclaimer, the term of this patent is extended or adjusted under 35 U.S.C. 154(b) by 80 days.

(21) Appl. No.: 15/715,973

(22) Filed: Sep. 26, 2017

(65) Prior Publication Data

US 2018/0246240 A1    Aug. 30, 2018

(30) Foreign Application Priority Data

Feb. 28, 2017  (KR) .................... 10-2017-0026726

(51) Int. Cl.
*G01V 1/30* (2006.01)
*G06F 17/50* (2006.01)

(52) U.S. Cl.
CPC ...... *G01V 1/305* (2013.01); *G01V 2210/6222* (2013.01); *G01V 2210/675* (2013.01); *G06F 17/50* (2013.01)

(58) Field of Classification Search
CPC ............. G01V 1/305; G01V 2210/675; G01V 2210/6222
See application file for complete search history.

(56) References Cited

U.S. PATENT DOCUMENTS

2012/0051179 A1*  3/2012  Shin .................. G01V 1/28
                                                  367/50

FOREIGN PATENT DOCUMENTS

KR  101172506 B1  8/2012
KR  101182838 B1  9/2012

OTHER PUBLICATIONS

Son et al., "An Efficient 3D traveltime calculation using coarse-grid mesh for shallow source", EGU General Assembly 2015, held Apr. 12-17, 2015 in Vienna, Austria (Year: 2015).*

(Continued)

*Primary Examiner* — Ian J Lobo
(74) *Attorney, Agent, or Firm* — Harness, Dickey & Pierce, P.L.C.

(57) ABSTRACT

The present invention relates generally to an apparatus and method for calculating efficient 3-dimensional (3D) traveltime by using coarse-grid mesh for a shallow depth source. More particularly, the present invention relates to an efficient 3D traveltime calculation method for a shallow depth source by combining a suppressed wave equation estimation of traveltime (SWEET) algorithm and an equivalent source distribution (ESD) algorithm, wherein the SWEET algorithm is a traveltime calculation algorithm using an damped wave equation and the ESD algorithm is for equivalently distributed sources; and to an apparatus and method for calculating efficient 3D traveltime by using coarse-grid mesh for a shallow depth source which may need less calculation time compared with that of a conventional SWEET algorithm.

10 Claims, 9 Drawing Sheets
(2 of 9 Drawing Sheet(s) Filed in Color)

(56) References Cited

OTHER PUBLICATIONS

Abdelkhalek, R., Calandra, H., Coulaud, O., Roman, J., Latu, G., 2009. Fast; seismic modeling and reverse time migration on a GPU cluster. High; Performance Computing and Simulation, Leipzig, Germany, 36-44.

Araya-Polo, M., Rubio, F., Cruz, R., Hanzich, M., Cela, J.M., Scarpazza,; D.P., 2009. 3D seismic imaging through reverse-time migration on; homogeneous and heterogeneous multi-core processors. Sci. Program. 17, 185-; 198.

Ben-Hadj-Ali, H., Operto, S., Virieux, J., 2009. Velocity model building by; 3D frequency-domain, full-waveform inversion of wide-aperture seismic data.; Geophysics 73, VE101-VE117.

Cha, Y.H., Shin, C., 2010. Two-dimensional Laplace domain waveform; inversion using adaptive meshes: and experience of the 2004 BP velocityanalysis; benchmark data set. Geophys. J. Int. 182, 865-879.

Cohen, G.C., 2002. Higher-order numerical methods for transient wave; equations. Springer, Berlin.

Coultrip, R.L., 1993. High-accuracy wavefront tracing traveltime calculation.; Geophysics 58, 284-292.

Kim, Y., Min, D., Shin, C., 2011. Frequency-domain reverse-time migration; with source estimation. Geophysics 76, S41-S49.

Marfurt, K.J., 1984. Accuracy of finite-difference and finiteelementmodeling; of the scalar and elastic wave equations. Geophysics 49, 533-549.

Plessix, R.E., 2009. Three-dimensional frequency domain full-waveform; inversion with an iterative solver. Geophysics 74, WCC149-WCC157.

Pyun, S., Shin, C., Chung, W., 2011a. Equivalent source distribution for; efficient 3-D acoustic wave equation modeling in the Laplace domain. Geophys.; J. Int. 186, 740-750.

Pyun, S., Son, W., Shin, C., 2011b. 3D acoustic waveform inversion in the; Laplace domain using an iterative solver. Geophys. Prospect. 59, 386-399.

Qin, Y., Zhang, Z., Shin, C., 2005. A robust and accurate traveltime; calculation using a frequency-domain two-way wave equation modeling; algorithm. J. Seism. Explor. 13, 227-245.

Shin, C., Cha, Y.H., 2008. Waveform inversion in the Laplace domain.; Geophys. J. Int. 173, 922-931.

Shin, C., Ko, S., Kim, W., Min, D., Yang, D., Marfurt, K.J., Shin, S., Yoon,; K., Yoon, C., 2003. Traveltime calculations from frequency domain downward; continuation algorithms. Geophysics 68, 1648-1655.

Shin, C., Min, D., Marfurt, K.J., Lim, H.Y., Yang, D., Cha, Y., Ko, S., Yoon,; K., Ha, T., Hong, S., 2002. Traveltime and amplitude calculations using the; damped wave solution. Geophysics 67, 1637-1647.

Son, W., Pyun, S., Shin, C., Kim, H.-J., 2014. Laplace-domain waveequation; modeling and full waveform inversion in 3D isotropic elastic media. J.; Appl. Geophys. 105, 120-132.

Vidale, J., 1988. Finite-difference calculation of traveltimes. Bull. Seismol.; Soc. Am. 78, 2062-2076.

Vidale, J., 1990. Finite-difference calculation of traveltimes in three; dimensions. Geophysics. 55, 521-526.

Yang, D., Shin, C., Marfurt, K.J., Kim, J., Ko, S., 2003. Three-dimensional; traveltime and amplitude computation using the suppressed wave equation; estimation of travel time (SWEET) algorithm. J. Seism. Explor. 12, 75-101.

Yoon, K., Shin, C., Su, S., Lines, L.R., Hong, S., 2003. 3D reverse-time; migration using the acoustic wave equation: An experience with the SEG/EAGE; data set. Lead. Edge 22, 38-41.

Woohyun Son, Sukjoon Pyun, Ho-Young Lee, Nam-Hyung Koo,; Changsoo Shin, 2016. An efficient 3D traveltime calculation using coarse-grid; mesh for shallow-depth source. Journal of Applied Geophysics 133 (2016) 25-; 29.

* cited by examiner

[FIG 1]
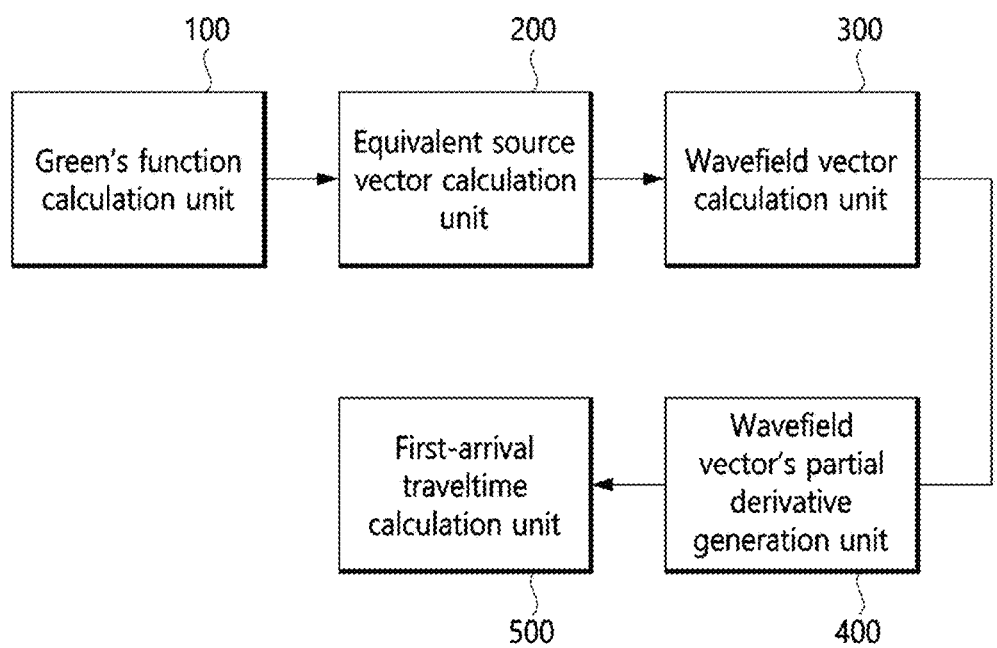

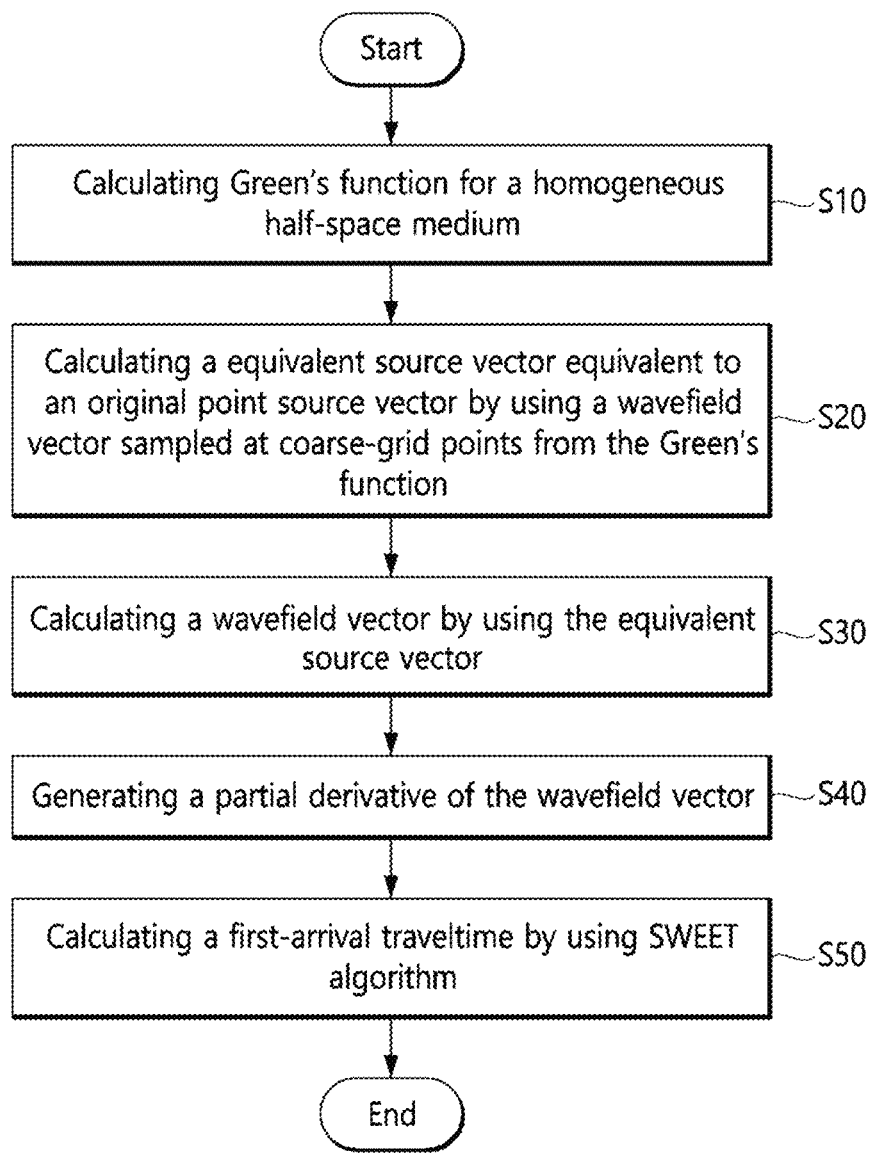
[FIG 2]

[FIG 3]
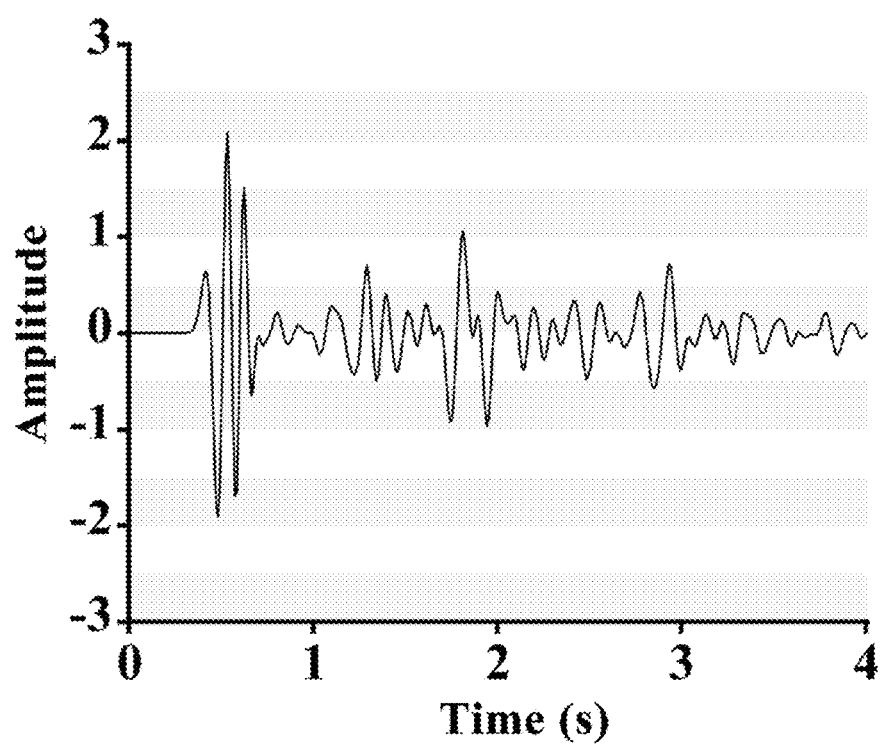

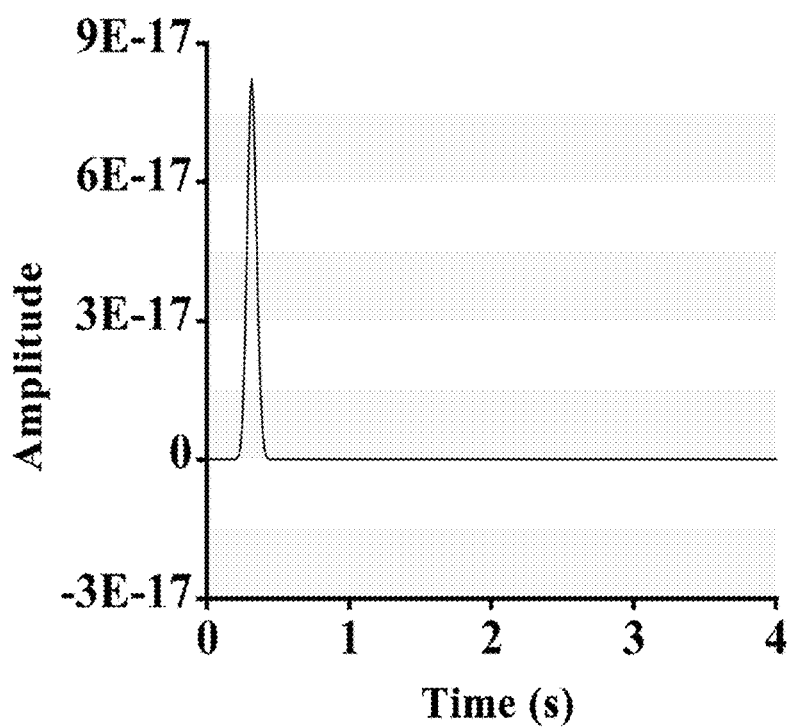
[FIG 4]

[FIG 5]
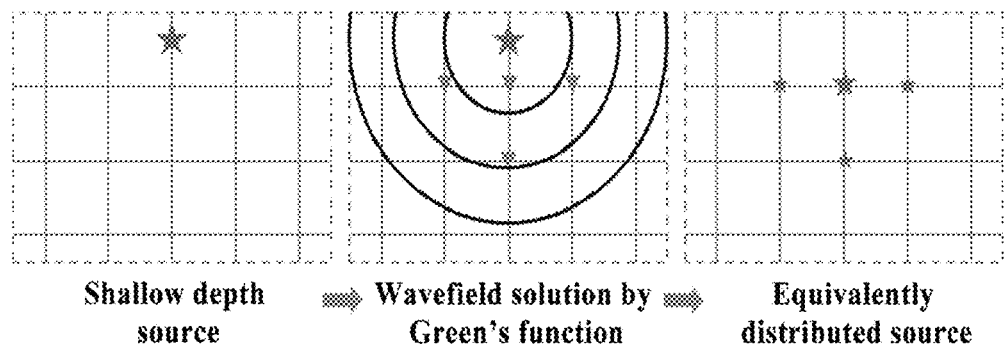

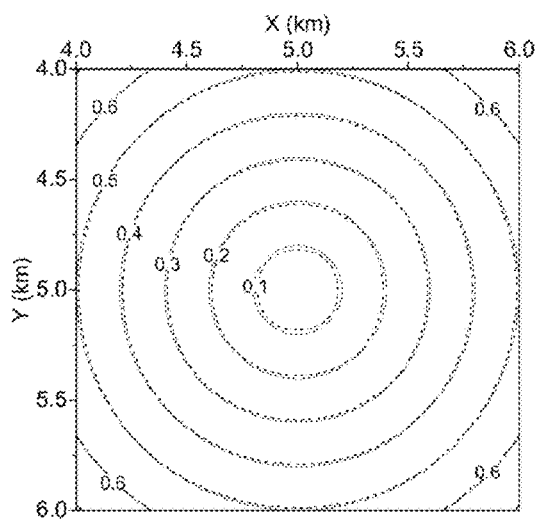
[FIG 6A]
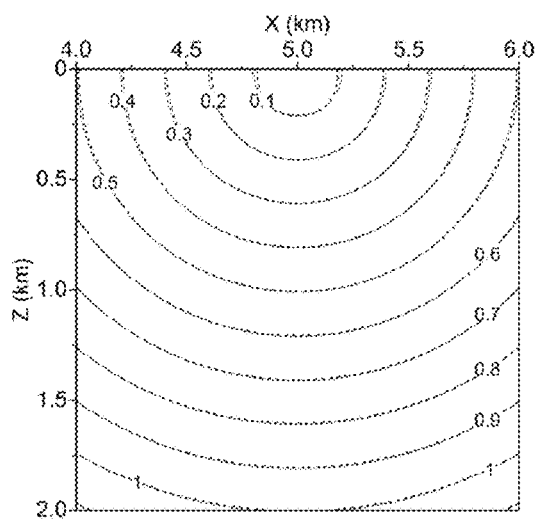
[FIG 6B]
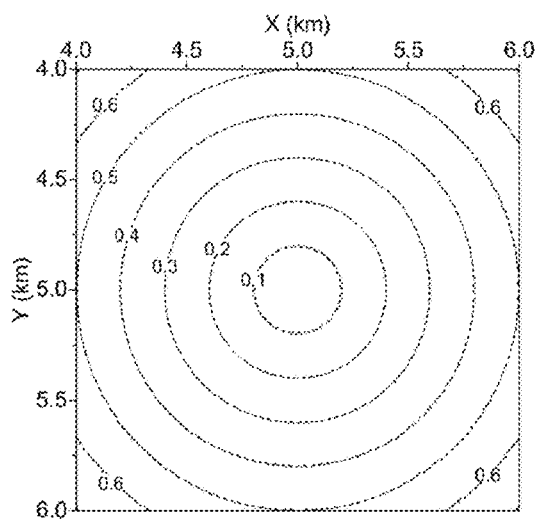
[FIG 6C]
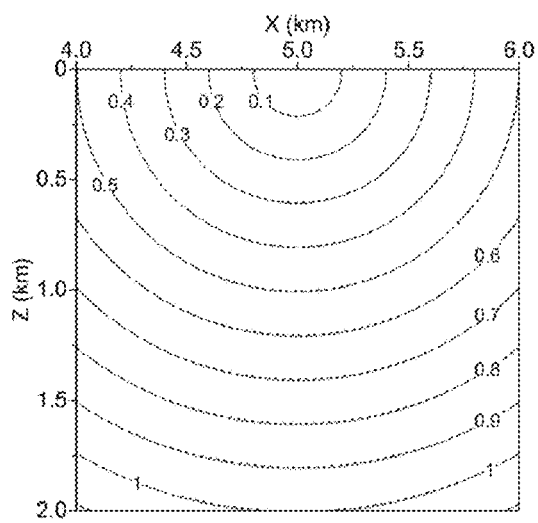
[FIG 6D]

[FIG 7]
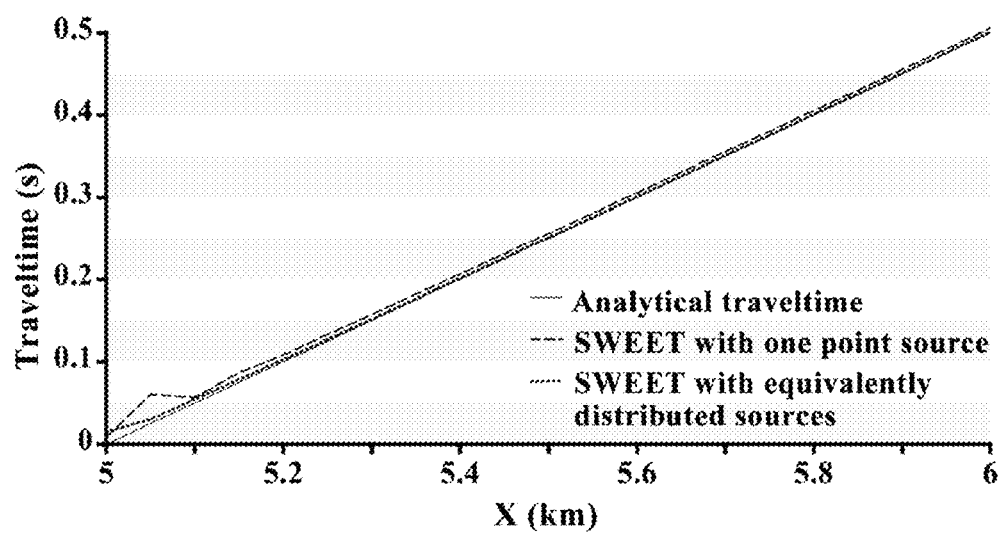

[FIG 8]
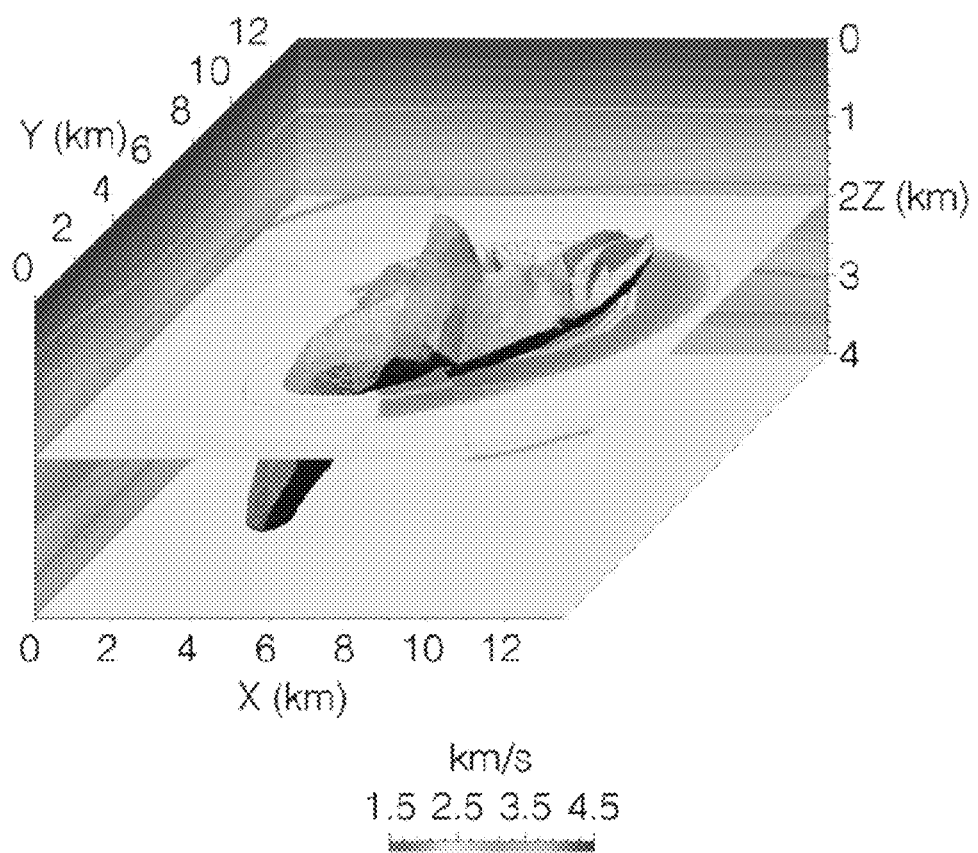

[FIG 9A]
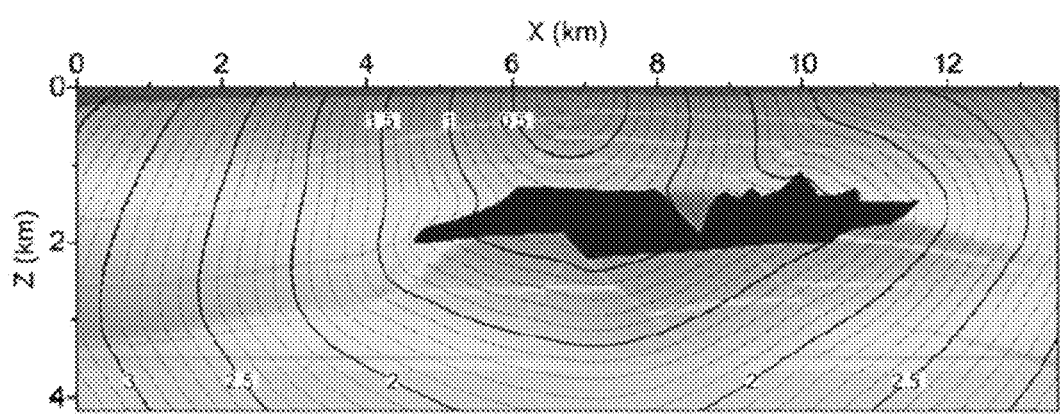
[FIG 9B]
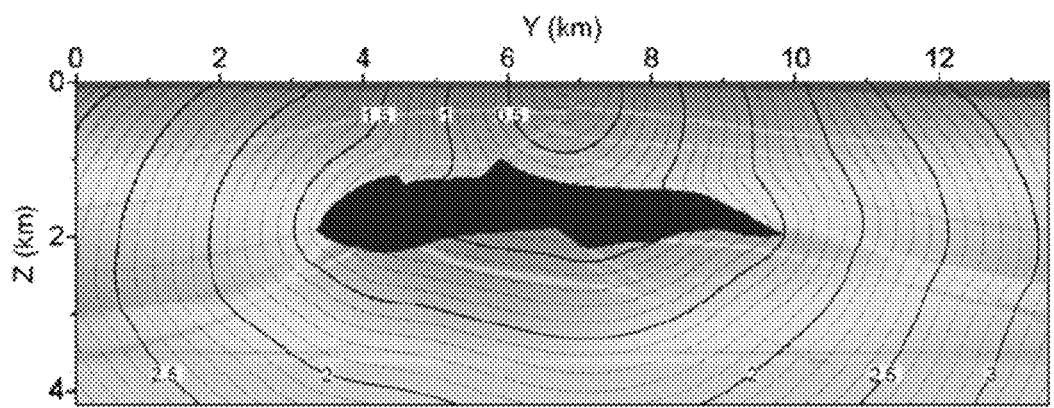

APPARATUS AND METHOD FOR CALCULATING EFFICIENT 3D TRAVELTIME BY USING COARSE-GRID MESH FOR SHALLOW DEPTH SOURCE

CROSS REFERENCE TO RELATED APPLICATION

The present application claims priority to Korean Patent Application No. 10-2017-0026726, filed Feb. 28, 2017, the entire contents of which is incorporated herein for all purposes by this reference.

TECHNICAL FIELD

The present invention relates generally to an apparatus and method for calculating efficient 3-dimensional (3D) traveltime by using coarse-grid mesh for a shallow depth source. More particularly, the present invention relates to an efficient 3D traveltime calculation method for the shallow depth source by combining a suppressed wave equation estimation of traveltime (SWEET) algorithm and an equivalent source distribution (ESD) algorithm, wherein the SWEET algorithm is a traveltime calculation algorithm using a damped wave equation and the ESD algorithm is for equivalently distributed sources; and an apparatus and method for calculating efficient 3D traveltime by using coarse-grid mesh for a shallow depth source which may need less calculation time compared with that of a conventional SWEET algorithm.

BACKGROUND ART

Recent advances of 3D seismic survey led to the development of the data processing technique for 3D seismic data. In particular, the use of 3D reverse-time migration to study subsurface structures has attracted much attention (Abdelkhalek et al., 2009; Araya-Polo et al., 2009; Kim et al., 2011; Yoon et al., 2003). As the reverse-time migration method became more popular, a more accurate velocity model was needed. As a result, recent research in data processing areas has focused on accurate velocity model building, and full waveform inversion is one of the available techniques. Recently, research on 3D full waveform inversion is carried out by many geophysicists (Ben-Hadj-Ali et al., 2009; Plessix, 2009; Pyun et al., 2011b; Son et al., 2014). Under these circumstances, a practical problem has arisen in that the reverse-time migration requires enormous computational costs to verify the usefulness of inversion results. Therefore, a cost-effective migration technique is needed to verify the waveform inversion results. Although Kirchhoff migration is not as accurate as reverse-time migration, it is efficient enough to verify 3D inversion results.

To carry out Kirchhoff migration, underground traveltime information is necessary, wherein the traveltime can be calculated by many algorithms such as various ray tracing methods (Coultrip, 1993), Eikonal solvers (Vidale, 1988; Vidale, 1990) and wave-equation-based algorithms (Shin et al., 2002; Shin et al., 2003; Qin et al., 2005), etc. Although ray tracing methods or Eikonal solvers are more efficient than wave-equation-based methods, wave-equation-based methods can properly handle caustics and other problems related to ray theory. In addition, wave-equation-based methods can compute amplitudes simultaneously, thus a wave-equation-based algorithm called the SWEET (Yang et al., 2003) is used, wherein the SWEET solves the wave equation in the Laplace domain. In this algorithm, a seismic trace is considered as a series of weighted spikes. By solving the wave equation in the Laplace domain, all the spikes except the first-arrival event are attenuated and become negligible. Thus, a seismic trace originating from a series of weighted spikes can be approximated by a single spike.

As a result, the first-arrival traveltime can be extracted from the solution of wave equation in the Laplace domain. To solve the Laplace domain wave equation, a standard finite-element method is used, wherein the method exploits the combination of consistent and lumped mass matrices. The resultant matrix equation is solved by preconditioned conjugate gradient method. A numerical modeling by the Laplace domain wave equation shows less numerical dispersion error than time-domain or frequency-domain modeling (Shin et al., 2002; Shin and Cha, 2008). This characteristic enables the numerical modeling to adopt large grid spacing. However, this choice hinders exact simulation of a shallow depth source for the modeling with a coarse-grid in acoustic media. Cha and Shin (2010) used adaptive meshes to solve this problem, but implementation thereof is very complicated and the algorithm does not converge well when an iterative solver is used.

A traveltime calculation method using a conventional SWEET algorithm will be described below. The SWEET algorithm, which was suggested by Shin et al. (2002), calculates the first-arrival travel time by solving the Laplace domain wave equation. Yang et al. (2003) applied the SWEET algorithm to a 3D problem using a direct large sparse matrix solver. To calculate a first-arrival traveltime, the SWEET algorithm makes use of an assumption that a seismic signal is equal to a series of weighted spikes (see FIG. 3). Multiplying this signal by exponentially decreasing the function of time, amplitudes of all spikes except first-arrival signal are attenuated and become negligible (see FIG. 4). Therefore, the seismic signal in the time domain, which is a series of weighted spikes, can be approximated to a single spiky pulse (Shin et al., 2002). This single spiky pulse equals the first-arrival signal in the time domain. Although the principle of the SWEET algorithm can be easily explained in the time domain, the actual traveltime calculation is performed in the Laplace domain. The first-arrival traveltime is calculated using the Laplace domain wavefield and its derivative. The first-arrival traveltime t is expressed by the following equation 1:

$$t(x, y, z, s_{opt}) = -\frac{1}{u(x, y, z, s_{opt})}\left[\frac{\partial u(x, y, z, s_{opt})}{\partial s}\right], \quad \text{(Equation 1)}$$

where u is a Laplace domain wavefield, S is a Laplace domain variable, and $S_{opt}$ is an optimal Laplace damping constant.

The optimal Laplace damping constant $S_{opt}$ can be determined by the following equation 2 (Shin et al., 2002):

$$s_{opt} = \frac{2\pi v_{ave}}{G\Delta} \quad \text{(Equation 2)}$$

where, $v_{ave}$ is an average velocity of a given model, $\Delta$ is a grid spacing, and G is a number of grid points per pseudo-wavelength.

The Laplace domain wavefield is obtained by solving the 3D acoustic wave equation in the Laplace domain by the following equation 3:

$$\frac{s^2}{v^2}u - \frac{\partial^2 u}{\partial x^2} - \frac{\partial^2 u}{\partial y^2} - \frac{\partial^2 u}{\partial z^2} = f, \qquad \text{(Equation 3)}$$

where, v is a propagation velocity in the medium, and f is a source function in the Laplace domain.

Using the finite-element method, equation 3 can be expressed as the linear algebraic system (Marfurt, 1984) by the following equations 4 and 5:

$$Su = f \qquad \text{(Equation 4)}$$

with $$S = K + s^2 M, \qquad \text{(Equation 5)}$$

where, S is the impedance matrix, u is the wavefield vector in the Laplace domain, f is the source vector in the Laplace domain, K is the stiffness matrix, and M is the mass matrix.

In the mean time, perfectly matched layer (PML) boundary condition is applied to eliminate unwanted edge reflections (Cohen, 2002).

To efficiently solve the equation 4, the preconditioned conjugate gradient method (Pyun et al., 2011b) is used. The partial derivative of wavefield in equation 1 is calculated by a back-propagation algorithm (Shin et al., 2002) by the following equation 6:

$$\frac{\partial u}{\partial s} = S^{-1}\left(-\frac{\partial S}{\partial s}u\right). \qquad \text{(Equation 6)}$$

The traveltime calculation method configured as above using the conventional SWEET algorithm can accurately calculate a wavefield when a source is located at a grid point with an assumption that grid spacing is small enough to avoid numerical dispersion. In particular, the Laplace domain wave equation allows accurate modeling for relatively large grid spacing when the source is located at a grid point. However, when a real source is located at shallow depth close to free surface, a problem arises that the wavefield cannot be accurately calculated by using coarse-grid spacing.

The foregoing is intended merely to aid in the understanding of the background of the present invention, and is not intended to mean that the present invention falls within the purview of the related art that is already known to those skilled in the art.

DOCUMENTS OF RELATED ART

Patent Documents (Patent Document 1) Korean patent No. 1172506
(Patent Document 2) Korean patent No. 1182838

Non-Patent Documents (Non-Patent Document 1) Abdelkhalek, R., Calandra, H., Coulaud, O., Roman, J., Latu, G., 2009. Fast seismic modeling and reverse time migration on a GPU cluster. High Performance Computing and Simulation, Leipzig, Germany, 36-44.
(Non-Patent Document 2) Araya-Polo, M., Rubio, F., Cruz, R., Hanzich, M., Cela, J. M., Scarpazza, D. P., 2009. 3D seismic imaging through reverse-time migration on homogeneous and heterogeneous multi-core processors. Sci. Program. 17, 185-198.
(Non-Patent Document 3) Ben-Hadj-Ali, H., Operto, S., Virieux, J., 2009. Velocity model building by 3D frequency-domain, full-waveform inversion of wide-aperture seismic data. Geophysics 73, VE101-VE117.
(Non-Patent Document 4) Cha, Y. H., Shin, C., 2010. Two-dimensional Laplace domain waveform inversion using adaptive meshes: and experience of the 2004 BP velocity-analysis benchmark data set. Geophys. J. Int. 182, 865-879.
(Non-Patent Document 5) Cohen, G. C., 2002. Higher-order numerical methods for transient wave equations. Springer, Berlin.
(Non-Patent Document 6) Coultrip, R. L., 1993. High-accuracy wavefront tracing traveltime calculation. Geophysics 58, 284-292.
(Non-Patent Document 7) Kim, Y., Min, D., Shin, C., 2011. Frequency-domain reverse-time migration with source estimation. Geophysics 76, S41-S49.
(Non-Patent Document 8) Marfurt, K. J., 1984. Accuracy of finite-difference and finite-element modeling of the scalar and elastic wave equations. Geophysics 49, 533-549.
(Non-Patent Document 9) Plessix, R. E., 2009. Three-dimensional frequency-domain full-waveform inversion with an iterative solver. Geophysics 74, WCC149-WCC157.
(Non-Patent Document 10) Pyun, S., Shin, C., Chung, W., 2011a. Equivalent source distribution for efficient 3-D acoustic wave equation modeling in the Laplace domain. Geophys. J. Int. 186, 740-750.
(Non-Patent Document 11) Pyun, S., Son, W., Shin, C., 2011b. 3D acoustic waveform inversion in the Laplace domain using an iterative solver. Geophys. Prospect. 59, 386-399.
(Non-Patent Document 12) Qin, Y., Zhang, Z., Shin, C., 2005. A robust and accurate traveltime calculation using a frequency-domain two-way wave-equation modeling algorithm. J. Seism. Explor. 13, 227-245.
(Non-Patent Document 13) Shin, C., Cha, Y. H., 2008. Waveform inversion in the Laplace domain. Geophys. J. Int. 173, 922-931.
(Non-Patent Document 14) Shin, C., Ko, S., Kim, W., Min, D., Yang, D., Marfurt, K. J., Shin, S., Yoon, K., Yoon, C., 2003. Traveltime calculations from frequency domain downward continuation algorithms. Geophysics 68, 1648-1655.
(Non-Patent Document 15) Shin, C., Min, D., Marfurt, K. J., Lim, H. Y., Yang, D., Cha, Y., Ko, S., Yoon, K., Ha, T., Hong, S., 2002. Traveltime and amplitude calculations using the damped wave solution. Geophysics 67, 1637-1647.
(Non-Patent Document 16) Son, W., Pyun, S., Shin, C., Kim, H.-J., 2014. Laplace-domain wave-equation modeling and full waveform inversion in 3D isotropic elastic media. J. Appl. Geophys. 105, 120-132.
(Non-Patent Document 17) Vidale, J., 1988. Finite-difference calculation of traveltimes. Bull. Seismol. Soc. Am. 78, 2062-2076.
(Non-Patent Document 18) Vidale, J., 1990. Finite-difference calculation of traveltimes in three dimensions. Geophysics. 55, 521-526.
(Non-Patent Document 19) Yang, D., Shin, C., Marfurt, K. J., Kim, J., Ko, S., 2003. Three-dimensional traveltime and amplitude computation using the suppressed wave equation estimation of traveltime (SWEET) algorithm. J. Seism. Explor. 12, 75-101.

(Non-Patent Document 20) Yoon, K., Shin, C., Su, S., Lines, L. R., Hong, S., 2003. 3D reverse-time migration using the acoustic wave equation: An experience with the SEG/EAGE data set. Lead. Edge 22, 38-41.

DISCLOSURE

Technical Problem

Accordingly, the present invention has been made keeping in mind to resolve the above problems occurring in the related art, and the present disclosure proposes: an efficient 3D traveltime calculation method for a shallow depth source, and an apparatus and method for calculating efficient 3D traveltime by using coarse-grid mesh for a shallow depth source which may need less calculation time compared with that of a conventional SWEET algorithm.

Technical Solution

In order to achieve the above object, according to one embodiment of the present invention, an apparatus for calculating efficient 3D traveltime by using coarse-grid mesh for shallow depth source, the apparatus includes a Green's function calculation unit configured to calculate Green's function for a homogeneous half-space medium; an equivalent source vector calculation unit configured to calculate an equivalent source vector equivalent to an original point source vector by using a wavefield vector sampled at coarse-grid points calculated by the Green's function calculation unit; a wavefield vector calculation unit configured to calculate a wavefield vector by using the equivalent source vector calculated by the equivalent source vector calculation unit; a wavefield vector's partial derivative generation unit configured to generate a partial derivative of the wavefield vector calculated by the wavefield vector calculation unit; and a first-arrival traveltime calculation unit configured to calculate a first-arrival traveltime by the SWEET algorithm by using the wavefield vector calculated by the wavefield vector calculation unit and the partial derivative of the wavefield vector generated by the wavefield vector's partial derivative generation unit.

According to one embodiment of the present invention, an apparatus for calculating efficient 3D traveltime by using coarse-grid mesh for shallow depth source, the Green's function calculation unit can calculate the Green's function by the following equation 7:

$$G(s, v_0, r_g, r_s, r'_s) = \frac{e^{-\frac{s}{v_0}|r_g - r_s|}}{4\pi|r_g - r_s|} - \frac{e^{-\frac{s}{v_0}|r_g - r'_s|}}{4\pi|r_g - r'_s|} \quad \text{(Equation 7)}$$

where $G(s, v_0, r_g, r_s, r'_s)$ is a Green's function, S is a Laplace domain variable, $v_0$ is a propagation velocity for the homogeneous half-space medium, $r_g$ is a position vector of the source, and $r'_s$ is a position vector of an imaginary source.

According to one embodiment of the present invention, an apparatus for calculating efficient 3D traveltime by using coarse-grid mesh for shallow depth source, the equivalent source vector calculation unit can calculate the equivalent source vector by the following equation 8:

$$f^{equi} = S\tilde{u}, \quad \text{(Equation 8)}$$

where $f^{equi}$ is a new equivalent source vector for the homogeneous half-space, S is an impedance matrix, and $\tilde{u}$ is the wavefield vector sampled at coarse-grid points from the analytical solution of equation 7.

According to one embodiment of the present invention, an apparatus for calculating efficient 3D traveltime by using coarse-grid mesh for shallow depth source, the wavefield vector calculation unit can calculate the wavefield vector by the following equation 9:

$$u^{equi} = S^{-1} f^{equi}, \quad \text{(Equation 9)}$$

where $u^{equi}$ is the wavefield vector generated from the equivalent source vector.

According to one embodiment of the present invention, an apparatus for calculating efficient 3D traveltime by using coarse-grid mesh for shallow depth source, the wavefield vector's partial derivative generation unit can generate a partial derivative of the wavefield vector by the following equation 10:

$$\frac{\partial u^{equi}}{\partial s} = S^{-1}\left(-\frac{\partial S}{\partial s} u^{equi}\right), \quad \text{(Equation 10)}$$

According to one embodiment of the present invention, an apparatus for calculating efficient 3D traveltime by using coarse-grid mesh for shallow depth source, the first-arrival traveltime calculation unit, calculate the first-arrival traveltime by the following equation 11:

$$t^{equi}(x, y, z, s_{opt}) = \quad \text{(Equation 11)}$$
$$-\frac{1}{u^{equi}(x, y, z, s_{opt})}\left[\frac{\partial u^{equi}(x, y, z, s_{opt})}{\partial s}\right].$$

where $t^{equi}$ is a first-arrival travel time, and $s_{opt}$ is optimal Laplace decay coefficient.

In order to achieve the above object, according to another embodiment of the present invention, a method for calculating efficient 3D traveltime by using coarse-grid mesh for shallow depth source, the method includes the steps of: (a) calculating, by the Green's function calculation unit, Green's function for a homogeneous half-space medium; (b) calculating, by the equivalent source vector calculation unit, an equivalent source vector equivalent to an original point source vector by using a wavefield vector sampled at coarse-grid points calculated by the (a); (c) calculating, by the wavefield vector calculation unit, a wavefield vector by using the equivalent source vector calculated by the (b); (d) generating, by the wavefield vector's partial derivative generation unit, a partial derivative of the wavefield vector calculated by the (c); and (e) calculating, by the first-arrival traveltime calculation unit, a first-arrival traveltime by the SWEET algorithm by the wavefield vector calculated by the (c) and the partial derivative of the wavefield vector generated by the (d).

According to another embodiment of the present invention, a method for calculating efficient 3D traveltime by using coarse-grid mesh for shallow depth source, the Green's function can be calculated in (a) by the following equation 7:

$$G(s, v_0, r_g, r_s, r'_s) = \frac{e^{-\frac{s}{v_0}|r_g - r_s|}}{4\pi|r_g - r_s|} - \frac{e^{-\frac{s}{v_0}|r_g - r'_s|}}{4\pi|r_g - r'_s|} \quad \text{(Equation 7)}$$

where $G(s,v_0,r_g,r_s,r'_s)$ is a Green's function, S is a Laplace domain variable, $v_0$ is a propagation velocity for the homogeneous half-space medium, $r_g$ is a position vector of the source and $r'_s$ is a position vector of an imaginary source.

According to another embodiment of the present invention, a method for calculating efficient 3D traveltime by using coarse-grid mesh for shallow depth source, the equivalent source vector can be calculated in (b) by the following equation 8:

$$f^{equi} = S\tilde{u}, \quad \text{(Equation 8)}$$

where $f^{equi}$ is a new equivalent source vector for the homogeneous half-space, S is an impedance matrix, and $\tilde{u}$ is the wavefield vector sampled at coarse-grid points from the analytical solution of the equation 7.

According to another embodiment of the present invention, a method for calculating efficient 3D traveltime by using coarse-grid mesh for shallow depth source, the wavefield vector can be calculated in (c) by the following equation 9:

$$u^{equi} = ^{-1}f^{equi}, \quad \text{(Equation 9)}$$

where $u^{equi}$ is the wavefield vector generated from the equivalent source vector.

According to another embodiment of the present invention, a method for calculating efficient 3D traveltime by using coarse-grid mesh for shallow depth source, the partial derivative of the wavefield vector can be generated in (d) by the following equation 10:

$$\frac{\partial u^{equi}}{\partial s} = S^{-1}\left(-\frac{\partial S}{\partial s}u^{equi}\right), \quad \text{(Equation 10)}$$

According to another embodiment of the present invention, a method for calculating efficient 3D traveltime by using coarse-grid mesh for shallow depth source, the first-arrival traveltime can be calculated in (e) by following equation 11:

$$t^{equi}(x,y,z,s_{opt}) = -\frac{1}{u^{equi}(x,y,z,s_{opt})}\left[\frac{\partial u^{equi}(x,y,z,s_{opt})}{\partial s}\right]. \quad \text{(Equation 11)}$$

where $t^{equi}$ is a first-arrival travel time, and $s_{opt}$ is optimal Laplace decay coefficient.

Advantageous Effects

According to the embodiment of the present invention, an apparatus and method for calculating efficient 3D traveltime by using coarse-grid mesh for a shallow depth source has an excellent effect of providing an efficient calculation method for the shallow depth source, and requiring less calculation time compared to a conventional SWEET algorithm, wherein the apparatus and method are configured to: calculate, by the Green's function calculation unit, Green's function for a homogeneous half-space medium; calculate, by the equivalent source vector calculation unit, an equivalent source vector equivalent to an original point source vector by using a wavefield vector sampled at coarse-grid points calculated by the Green's function calculation unit; calculate, by the wavefield vector calculation unit, a wavefield vector by using the equivalent source vector calculated by the equivalent source vector calculation unit; generate, by the wavefield vector's partial derivative generation unit, a partial derivative of the wavefield vector calculated by the wavefield vector calculation unit; and calculate, by the first-arrival traveltime calculation unit, a first-arrival traveltime by the SWEET by using the wavefield vector calculated by the wavefield vector calculation unit and the partial derivative of the wavefield vector generated by the wavefield vector's partial derivative generation unit.

That is, according to the embodiment of the present invention, an apparatus and method for calculating efficient 3D traveltime by using coarse-grid mesh for shallow depth source is configured to: combine the SWEET and ESD algorithms, whereby the combination of SWEET and ESD algorithms can be successfully used for the traveltime calculation under the condition of a shallow depth source; and use coarse-grid mesh, wherein the algorithm using coarse-grid mesh has an excellent effect in that less computational time is required than the conventional SWEET algorithm using relatively fine-grid mesh, and wherein the SWEET algorithm is a traveltime calculation algorithm using a damped wave equation, and the ESD algorithm is a method to define a set of distributed nodal sources that approximate a point source at the inter-nodal location in a velocity model with large grid spacing.

DESCRIPTION OF DRAWINGS

The patent or application file contains at least one drawing executed in color. Copies of this patent or patent application publication with color drawing(s) will be provided by the Office upon request and payment of the necessary fee.

The above and other objects, features and other advantages of the present invention will be more clearly understood from the following detailed description when taken in conjunction with the accompanying drawings, in which:

FIG. 1 is a. block diagram illustrating an apparatus for calculating efficient 3D traveltime by using coarse-grid mesh for a shallow depth source according to an embodiment of the present invention.

FIG. 2 is a flow chart illustrating a method for using the apparatus for calculating efficient 3D traveltime by using coarse-grid mesh for a shallow depth source according to an embodiment of the present invention.

FIG. 3 is a graph illustrating that a seismic signal is equal to a series of weighted spikes, which is assumed to calculate first traveltime in a method of traveltime calculation by using a SWEET algorithm according to a conventional art.

FIG. 4 is a graph illustrating that multiplying the signal of the FIG. 3 by exponentially decreasing function of time, amplitudes of all spikes except first-arrival signal are attenuated and become negligible.

FIG. 5 is a diagram illustrating a conceptual ESD algorithm applied in an embodiment of the present invention.

FIGS. 6A, 6B, 6C, and 6D are diagrams to verify the effect of the ESD algorithm applied in an embodiment of the present invention, wherein FIGS. 6A and 6B, respectively, are diagrams (conventional art) illustrating traveltime contours of X-Y section and X-Z section, calculated by using the SWEET algorithm having original one point source for homogeneous medium; and FIGS. 6C and 6D, respectively, are diagrams (the present invention) illustrating traveltime contours of X-Y section and X-Z section, calculated by using the SWEET algorithm having equivalently distributed sources for homogeneous medium.

FIG. 7 is a diagram illustrating traveltime curves along X-direction (Y=5 km) from the X-Y section shown in FIGS. 6A and 6C.

FIG. 8 is a perspective view of a SEG/EAGE 3D salt model used to verify algorithm applied in an embodiment of the present invention.

FIGS. 9A and 9B are diagrams illustrating traveltime contours of X-Z section and Y-Z section, respectively, where a source is located at 20 m depth for SEG/EAGE 3D salt model.

DESCRIPTION OF THE REFERENCE NUMERALS IN THE DRAWINGS

100: Green's function calculation unit
200: Equivalent source vector calculation unit
300: Wavefield vector calculation unit
400: Wavefield vector's partial derivative generation unit
500: First-arrival traveltime calculation unit

MODE FOR INVENTION

Hereinbelow, exemplary embodiments of the present invention will be described in detail with reference to the accompanying drawings. Throughout the drawings, the same reference numerals will refer to the same or like parts.

FIG. 1 is a block diagram illustrating an apparatus for calculating efficient 3D traveltime by using coarse-grid mesh for a shallow depth source according to an embodiment of the present invention; FIG. 5 is a diagram illustrating a conceptual ESD algorithm applied in an embodiment of the present invention; FIGS. 6A, 6B, 6C, and 6D are diagrams to verify the effect of the ESD algorithm applied in an embodiment of the present invention, wherein FIGS. 6A and 6B, respectively, are diagrams (conventional art) illustrating traveltime contours of X-Y section and X-Z section, calculated by using a SWEET algorithm having an original one point source for a homogeneous medium; and FIGS. 6C and 6D, respectively, are diagrams (the present invention) illustrating traveltime contours of an X-Y section and an X-Z section, calculated by using the SWEET algorithm having equivalently distributed sources for homogeneous medium; FIG. 7 is a diagram illustrating traveltime curves along X-direction (Y=5 km) from the X-Y section shown in FIGS. 6A and 6C; FIG. 8 is a perspective view of a SEG/EAGE 3D salt model used to verify algorithm applied in an embodiment of the present invention; and FIGS. 9A and 9B are diagrams illustrating traveltime contours of X-Z section and Y-Z section, respectively, where a source is located at a 20 m depth for the SEG/EAGE 3D salt model.

First, the ESD algorithm applied in the present invention will be described. The ESD algorithm is a method to define a set of distributed nodal sources that approximate a point source at the inter-nodal location in a velocity model with large grid spacing and an algorithm to perform more efficient and accurate modeling of the 3D Laplace domain wave equation for a coarse-grid velocity model. FIG. 5 is a diagram illustrating an conceptual ESD algorithm and a point source located at shallow depth is transformed into a plurality (four in the diagram) of equivalently distributed source by using the solution for the wavefield by Green's function.

According to an embodiment of the present invention, an apparatus for calculating efficient 3D traveltime by using coarse-grid mesh for a shallow depth source, as illustrated in FIG. 1, includes: a Green's function calculation unit 100; an equivalent source vector calculation unit 200; a wavefield vector calculation unit 300; a wavefield vector's partial derivative generation unit 400; and a first-arrival traveltime calculation unit 500.

The Green's function calculation unit 100 calculates Green's function for a homogeneous half-space medium. The Green's function calculation unit 100 calculates the Green's function by the following equation 7:

$$G(s, v_0, r_g, r_s, r'_s) = \frac{e^{-\frac{s}{v_0}|r_g - r_s|}}{4\pi|r_g - r_s|} - \frac{e^{-\frac{s}{v_0}|r_g - r'_s|}}{4\pi|r_g - r'_s|} \quad \text{(Equation 7)}$$

where $G(s,v_0,r_g,r_s,r'_s)$ is a Green's function, S is a Laplace domain variable, $v_0$ is a propagation velocity for the homogeneous half-space medium, $r_g$ is a position vector of the source and $r'_s$ is a position vector of an imaginary source.

The equivalent source vector calculation unit 200 plays calculates the equivalent source vector equivalent to an original point source vector by using the wavefield vector sampled at coarse-grid points of the Green's function calculated by the Green's function calculation unit 100 and the impedance matrix for the coarse-grid mesh. The equivalent source vector calculation unit 200 calculates the equivalent source vector by the following equation 8:

$$f^{equi} = S\tilde{u}, \quad \text{(Equation 8)}$$

where $f^{equi}$ is a new equivalent source vector for the homogeneous half-space, S is an impedance matrix, and $\tilde{u}$ is the wavefield vector sampled at coarse-grid points from the analytical solution of equation 7.

The wavefield vector calculation unit 300 calculates, as shown in the equations 4 and 6, the wavefield vector by using the equivalent source vector calculated by the equivalent source vector calculation unit 200. The wavefield vector calculation unit 300 calculates the wavefield vector by the following equation 9:

$$u^{equi} = S^{-1}f^{equi}, \quad \text{(Equation 9)}$$

where $u^{equi}$ is the wavefield vector generated from the equivalent source vector.

The wavefield vector's partial derivative generation unit 400 generates a partial derivative of the wavefield vector calculated by the wavefield vector calculation unit 300. The wavefield vector's partial derivative generation unit 400 generates a partial derivative of the wavefield vector by the following equation 10:

$$\frac{\partial u^{equi}}{\partial s} = S^{-1}\left(-\frac{\partial S}{\partial s}u^{equi}\right), \quad \text{(Equation 10)}$$

The first-arrival traveltime calculation unit 500 calculates the first-arrival traveltime by the SWEET algorithm by using the wavefield vector calculated by the wavefield vector calculation unit 300 and the partial derivative of the wavefield vector generated by the wavefield vector's partial derivative generation unit 400. The first-arrival traveltime calculation unit 500 calculates the first-arrival traveltime by the following equation 11:

$$t^{equi}(x, y, z, s_{opt}) = \quad \text{(Equation 11)}$$

$$-\frac{1}{u^{equi}(x, y, z, s_{opt})} \left[ \frac{\partial u^{equi}(x, y, z, s_{opt})}{\partial s} \right].$$

where $t^{equi}$ is a first-arrival travel time, and $S_{opt}$ is optimal Laplace decay coefficient.

Meanwhile, the Green's function calculation unit 100, the equivalent source vector calculation unit 200, the wavefield vector calculation unit 300, the wavefield vector's partial derivative generation unit 400, and the first-arrival traveltime calculation unit 500 described above can be configured into one terminal device (e.g., a notebook, a personal computer, a PMP, etc.).

Hereafter, according to the embodiment, configured as above, of the present invention, a method for calculating efficient 3D traveltime by using coarse-grid mesh for a shallow depth source will be described.

FIG. 2 is a flow chart illustrating a method for using, according to the embodiment of the present invention, the apparatus for calculating efficient 3D traveltime by using coarse-grid mesh for a shallow depth source, wherein S shown in the figure stands for step.

First, the Green's function calculation unit 100 calculates the Green's function (S10), by equation 7.

Then, the equivalent source vector calculation unit 200 calculates the equivalent source vector equivalent to an original point source vector by using the wavefield vector sampled at coarse-grid points of the Green's function calculated by step S10 and the impedance matrix for the coarse-grid mesh (S20), wherein the equivalent source vector is calculated by equation 8.

In step S30, the wavefield vector calculation unit 300 calculates the wavefield vector by using the equivalent source vector calculated by step S20, wherein the wavefield vector is calculated by equation 9.

In step S40, the wavefield vector's partial derivative generation unit 400 generates a partial derivative of the wavefield vector calculated by step S30, wherein the wavefield vector's partial derivative generation is performed by equation 10.

In step S50, the first-arrival traveltime calculation unit 500 calculates the first-arrival traveltime by the SWEET algorithm by using the wavefield vector calculated by step S30 and the partial derivative of the wavefield vector generated by step S40, wherein the first-arrival traveltime calculation is performed by equation 11.

In the meantime, according to the embodiment of the present invention, described above, the method for calculating 3D traveltime focuses on the shallow depth sources located close to free surface. However, when sources are located at a deep area, the wavefield (or traveltime) can be simulated by using coarse-grid mesh without the ESD algorithm. In addition, by employing an interpolation algorithm (e.g. tri-linear interpolation), the source can just be distributed to the neighboring grid points. Meanwhile, the ESD algorithm can be straightforwardly applied to deep sources as well.

For the verification of the method for calculating 3D traveltime according to the embodiment of the present invention, numerically calculated traveltimes and analytically calculated traveltimes for a homogeneous half-space medium will be compared hereafter.

The constant velocity of the homogeneous model is 2000 m/s, and the model size is 10 km×10 km×10 km with a grid spacing of 50 m. The source point is located at the center of X-Y plane and at 10 m deep in Z-direction from the free surface. The optimal Laplace damping constant was calculated by using equation 2. In equation 2, 25 of G, which is the number of grid points per pseudo-wavelength, was used, and numerical dispersion errors were confirmed as being less than 0.4% with G=25 from the dispersion analysis.

In FIGS. 6A, 6B, 6C, and 6D, traveltime contours are plotted in X-Y section and X-Z section which include source point. To verify the effect of the ESD algorithm for the numerical calculation of traveltime, two different methods were tested.

One is the SWEET algorithm with an original point source and the other is the SWEET algorithm with equivalently distributed point sources.

When the equivalently distributed point sources are not used, a point source which is mislocated at a depth of 50 m should be used, which leads to incorrectly calculated first-arrival traveltimes (FIGS. 6A and 6B).

However, the numerical traveltimes obtained by the SWEET and ESD algorithms agree with the analytical traveltimes due to the appropriate representation of the point source at 10 m depth (FIGS. 6C and 6D). To evaluate the accuracy of the results, Traveltime curves (FIG. 7) along X-direction (Y=5 km) from the X-Y section shown in FIGS. 6A and 6C were extracted. From FIG. 7, it can also be confirmed that the traveltimes obtained by the SWEET with ESD algorithm are more accurate than those obtained by the SWEET algorithm with a mislocated point source.

For the verification of the method for calculating 3D traveltime of the present invention for a complicated heterogeneous medium, the first-arrival traveltime for the SEG/EAGE 3D salt model (FIG. 8) was calculated.

Unlike the homogeneous model examples, the coarse-grid wavefield vector should be sampled from the exact fine-grid solution. However, the traveltime calculation for the heterogeneous medium requires more computational time to obtain the fine-grid solution. To overcome this difficulty for a heterogeneous medium, the wavefields for a heterogeneous medium were simulated by using the equivalent source for a homogeneous half-space. This demonstrated that the equivalent source for a homogeneous velocity model can be applied to a heterogeneous velocity model without losing accuracy.

Therefore, the heterogeneous medium (i.e. SEG/EAGE 3D salt model) was simulated by using the equivalent source for a homogeneous half-space. The model size was 13.6 km×13.6 km×4.2 km and the source point was located at the center of X-Y plane and at 20 m deep in Z-direction from the free surface.

FIGS. 9A and 9B illustrate traveltime contours plotted in X-Z section and Y-Z section, respectively, which include source point.

Dashed lines illustrate the first-arrival traveltimes calculated by using the SWEET algorithm and the equivalently distributed point sources with 40 m grid spacing.

Solid lines illustrate the first-arrival traveltime calculated by using the SWEET algorithm and one point source with 20 m grid spacing.

The traveltimes using 20 m grid spacing (as a reference) were used to compare with the results of the algorithm of the present invention using 40 m grid spacing.

From FIGS. 9A and 9B, it was confirmed that the traveltime calculated by the SWEET and ESD algorithms with 40 m grid spacing is analogous to the traveltime calculated by the SWEET and one point source with 20 m grid spacing.

The computational time of the SWEET algorithm is improved by about 15 times when doubled grid spacing (40 m instead of 20 m) with the ESD algorithm is used. Although the wave-equation-based traveltime calculation is not as efficient as certain traditional traveltime algorithms, the calculation can preserve the benefit of wave-equation-based algorithm (e.g. there is no shadow zone) while simultaneously enhancing the efficiency of traveltime calculation.

According to the embodiments of the present invention, an apparatus and method for calculating efficient 3D traveltime by using coarse-grid mesh for a shallow depth source may provide an efficient calculation method for the shallow depth source, and reduce calculation time needed compared with that of a conventional SWEET algorithm, wherein the apparatus and method are configured to: calculate, by the Green's function calculation unit, Green's function for a homogeneous half-space medium; calculate, by the equivalent source vector calculation unit, an equivalent source vector equivalent to an original point source vector by using a wavefield vector sampled at coarse-grid points calculated by the Green's function calculation unit; calculate, by the wavefield vector calculation unit, a wavefield vector by using the equivalent source vector calculated by the equivalent source vector calculation unit; generate, by the wavefield vector's partial derivative generation unit, a partial derivative of the wavefield vector calculated by the wavefield vector calculation unit; and calculate, by the first-arrival traveltime calculation unit, a first-arrival traveltime by the SWEET by using the wavefield vector calculated by the wavefield vector calculation unit and the partial derivative of the wavefield vector generated by the wavefield vector's partial derivative generation unit.

That is, according to the embodiment of the present invention, an apparatus and method for calculating efficient 3D traveltime by using coarse-grid mesh for shallow depth source is configured to: combine the SWEET and ESD algorithms, whereby the combination of the SWEET and ESD algorithms can be successfully used for the traveltime calculation under the condition of a shallow depth source, and use a coarse-grid mesh, wherein the algorithm using a coarse-grid mesh may require less computational time than the conventional SWEET algorithm using a relatively fine-grid mesh, and wherein the SWEET algorithm is a traveltime calculation algorithm using a damped wave equation, and an ESD algorithm is a method to define a point source at the inter-nodal location in a velocity model with large grid spacing as a set of distributed nodal sources.

Although optimal embodiments are disclosed and specific terminologies are used in the drawings and the specification, these are used for illustrative purposes only but not to limit the meaning of them or the scope of the invention described in claims. Therefore, those skilled in the art will appreciate that various substitutions, changes, and modifications are possible without departing from the scope and spirit of the present invention. Accordingly, the real technical protection scope of the present invention should be defined by the technical concept of the attached claims.

What is claimed is:

1. An apparatus for calculating efficient 3D traveltime by using coarse-grid mesh for a shallow depth source, the apparatus comprising:
   a Green's function calculation unit configured to calculate a Green's function for a homogeneous half-space medium;
   an equivalent source vector calculation unit configured to calculate an equivalent source vector equivalent to an original point source vector by using a wavefield vector sampled at coarse-grid points calculated by the Green's function calculation unit;
   a wavefield vector calculation unit configured to calculate the wavefield vector by using the equivalent source vector calculated by the equivalent source vector calculation unit;
   a wavefield vector's partial derivative generation unit configured to generate a partial derivative of the wavefield vector calculated by the wavefield vector calculation unit; and
   a first-arrival traveltime calculation unit configured to calculate a first-arrival traveltime by a suppressed wave equation estimation of traveltime (SWEET) algorithm with both the wavefield vector calculated by the wavefield vector calculation unit and the partial derivative of the wavefield vector generated by the wavefield vector's partial derivative generation unit,
   wherein the Green's function calculation unit calculates the Green's function by the following equation 1:

$$G(s, v_0, r_g, r_s, r_s') = \frac{e^{-\frac{s}{v_0}|r_g - r_s|}}{4\pi |r_g - r_s|} - \frac{e^{-\frac{s}{v_0}|r_g - r_s'|}}{4\pi |r_g - r_s'|}$$

where G (s, $v_0$, $r_g$, $r_s$, $r_s'$) is the Green's function, S is a Laplace domain variable, $v_0$ is a propagation velocity for the homogeneous half-space medium, $r_g$ is a position vector of the shallow depth source and $r_s'$ is a position vector of an imaginary source.

2. The apparatus of claim 1, wherein the equivalent source vector calculation unit calculates the equivalent source vector by the following equation 2:

$$f^{equi} = S\ddot{u}$$

where $f^{equi}$ is a new equivalent source vector for ahomogeneous half-space, S is an impedance matrix, and ü is the wavefield vector sampled at the coarse-grid points from an analytical solution of the equation 1.

3. The apparatus of claim 2, wherein the wavefield vector calculation unit calculates the wavefield vector by the following equation 3:

$$u^{equi} = S^{-1} f^{equi}$$

where $u^{equi}$ is the wavefield vector generated from the equivalent source vector.

4. The apparatus of claim 3, wherein the wavefield vector's partial derivative generation unit generates the partial derivative of the wavefield vector by the following equation 4:

$$\frac{\partial u^{equi}}{\partial s} = S^{-1}\left(-\frac{\partial S}{\partial s} u^{equi}\right).$$

5. The apparatus of claim 4, wherein the first-arrival traveltime calculation unit calculates the first-arrival traveltime by the following equation 5:

$$t^{equi}(x, y, z, S_{opt}) = -\frac{1}{u^{equi}(x, y, z, Sopt)}\left[\frac{\partial u^{equi}(x, y, z, Sopt)}{\partial s}\right]$$

where $t^{equi}$ is the first-arrival traveltime, and $S_{opt}$ is an optimal Laplace decay coefficient.

6. A method of calculating efficient 3D traveltime by using coarse-grid mesh for a shallow depth source, the method comprising:

calculating, by a Green's function calculation unit, a Green's function for a homogeneous half-space medium;

calculating, by an equivalent source vector calculation unit, an equivalent source vector equivalent to an original point source vector by using a wavefield vector sampled at coarse-grid points calculated at the calculating the Green's function;

calculating, by a wavefield vector calculation unit, the wavefield vector by using the equivalent source vector calculated at the calculating the equivalent source vector;

generating, by the wavefield vector's partial derivative generation unit, a partial derivative of the wavefield vector calculated at the calculating the wavefield vector; and calculating, by a first-arrival traveltime calculation unit, a first-arrival traveltime by using a SWEET algorithm with both the wavefield vector calculated at the calculating the wavefield vector and the partial derivative of the wavefield vector generated at the generating the partial derivative of the wavefield vector, wherein at the calculating the Green's function, the Green's function is calculated by the following equation 6:

$$G(s, v_0, r_g, r_s, r_s') = \frac{e^{-\frac{s}{v_0}|r_g - r_s|}}{4\pi|r_g - r_s|} - \frac{e^{-\frac{s}{v_0}|r_g - r_s'|}}{4\pi|r_g - r_s'|}$$

where $G(s, v_0, r_g, r_s, r_s')$ is the Green's function, S is a Laplace domain variable, $v_0$ is a propagation velocity for the homogeneous half-space medium, $r_g$ is a position vector of the shallow depth source and $r_s'$ is a position vector of an imaginary source.

7. The method of claim 6, wherein at the calculating the equivalent source vector, the equivalent source vector is calculated by the following equation 7:

$$f^{equi} = S\tilde{u}$$

where $f^{equi}$ is a new equivalent source vector for the homogeneous half-space, S is an impedance matrix, and $\tilde{u}$ is the wavefield vector sampled at the coarse-grid points from an analytical solution of the equation 6.

8. The method of claim 7, wherein at the calculating the wavefield vector, the wavefield vector is calculated by the following equation 8:

$$u^{equi} = S^{-1} f^{equi}$$

where $u^{equi}$ is the wavefield vector generated from the equivalent source vector.

9. The method of claim 8, wherein at the generating the partial derivative of the wavefield vector, the partial derivative of the wavefield vector is generated by the following equation 9:

$$\frac{\partial u^{equi}}{\partial s} = S^{-1}\left(-\frac{\partial S}{\partial s} u^{equi}\right).$$

10. The method of claim 9, wherein at the calculating the first-arrival traveltime, the first-arrival traveltime is calculated by the following equation 10:

$$t^{equi}(x, y, z, S_{opt}) = -\frac{1}{u^{equi}(x, y, z, S_{opt})}\left[\frac{\partial u^{equi}(x, y, z, S_{opt})}{\partial s}\right]$$

where $t^{equi}$ is the first-arrival traveltime and $S_{opt}$ is an optimal Laplace damping constant.

* * * * *